United States Patent [19]

Huang

[11] Patent Number: 5,158,906
[45] Date of Patent: Oct. 27, 1992

[54] METHOD OF PRODUCING DIELECTRIC ISOLATED SINGLE CRYSTALLINE THIN FILM

[76] Inventor: Chi-Tso Huang, 5044 Capistrano Ave., San Jose, Calif. 95129

[21] Appl. No.: 714,500

[22] Filed: Jun. 13, 1991

[51] Int. Cl.$^5$ .................. H01L 21/70; H01L 27/00
[52] U.S. Cl. .................. 437/61; 437/973; 437/89; 437/14; 437/173; 437/62
[58] Field of Search ............... 437/973, 14, 62, 173, 437/61, 89

[56] References Cited

U.S. PATENT DOCUMENTS

| | | | |
|---|---|---|---|
| 4,141,757 | 2/1979 | Cline et al. | 437/14 |
| 4,487,635 | 12/1984 | Kugimiya et al. | 437/173 |
| 4,670,088 | 6/1987 | Tsaur et al. | 156/616.3 |
| 4,700,454 | 10/1987 | Baerg et al. | 437/24 |
| 4,751,193 | 6/1988 | Myrick | 437/19 |
| 4,789,771 | 12/1988 | Robinson et al. | 219/405 |
| 5,059,770 | 10/1991 | Mahawili | 219/464 |

FOREIGN PATENT DOCUMENTS 0191089  9/1985  Japan .

OTHER PUBLICATIONS

Douglas; "The Route to 3-D Chips"; High Technology; Sep. 1983, pp. 55-59.
"VLSI Fabrication Principles, Silicon and Gallium Arsenide" by S. K. Ghandhi, pp. 570-572, 1983.
"Simox: Buried Layer Formation by Ion Implantation—Equipment and Techniques" by A. B. Wittkower et al. Nuclear Inst. and Methods, B37/38 (1989) pp. 512-517.
"SOI Epitaxial Technology, Perspective: 15E or Simox?" by R. L. Bates p. 11, Microelectronic Manufacturing and Testing, Mar. 1989.

*Primary Examiner*—Brian E. Hearn
*Assistant Examiner*—Trung Dang

[57] ABSTRACT

The centrifugally tensional, horizontally recrystallizing process for forming the dielectric isolated semiconductor starting wafer materials is described. Wafer with oxide and deposited polycrystalline silicon film, is put on top of a horizontal rotating stage, and secured by vacuum. Recrystallization of the polycrystalline film into single crystalline is carried out by concentric heating elements located directly above and aligned concentrically with the spinning wafer. The recrystallization will proceed from the center of the wafer radially outward into the film area that covers the whole wafer.

3 Claims, 1 Drawing Sheet

METHOD OF PRODUCING DIELECTRIC ISOLATED SINGLE CRYSTALLINE THIN FILM

FIELD OF INVENTION

The present invention is concerned with methods of forming the dielectric isolated semiconductor starting materials (or wafers). In particular, the process and resulting structure are involved in recrystallizing a polycrystalline semiconductor layer which is deposited on a previously oxidized semiconductor starting wafer, and converting it into a monocrystalline film.

DESCRIPTION OF THE PRIOR ART

In the semiconductor integrated circuit technology, it is necessary to minimize the leakage current and all the parasitic effects of the bulk silicon substrate on active devices area. Over the years, there have been few such methods developed which are well-known to one skilled in the art.

One of the prior art in obtaining oxide isolation in silicon wafers is described on pp. 570–572 of "VLSI FABRICATION PRINCIPLES, Silicon and Gallium Arsenide by Sorab K. Ghandhi", which involves the process steps of V-shaped grooves etching into N-type (100) silicon wafers, then thermal isolation oxide growing and polycrystalline silicon supporting layer depositing, and the final step of mechanical grinding of the (100) silicon bulk substrate to from the isolated single crystalline silicon tubs. This is an old, but the best known process to manufacture the dielectric isolated wafers. In fact, this basic process, with some minor modifications, is still used by some semiconductor integrated circuit manufacturers today. The major disadvantage of this type of process is due to the use of relatively less controllable mechanical means in thinning the wafers. For most of todays advanced IC products, uniform, precise and isolated thin single crystalline silicon layer is essential. Any modified version of this basic process will not meet the requirements of current and future technologies.

Another type of prior art involves implanting oxygen ions into a silicon wafers, then converting them into oxide through a thermal process. One example of this type of method is disclosed in William Baerg et al., U.S. Pat. No. 4,700,454. William Baerg et al. describe that oxygen is implanted into the wafer that is controlled by a masking member and self-aligned with the buried oxide region. Buried oxide is formed after the wafer is subjected to a annealing cycle with inert gas ambience. Andrew B. Wittkower et al., "SIMOX: Buried Layer Formation by Ion Implantation-Equipment and Techniques" Nucl. Instr. and Method B37/38(1989) pp. 512 is another such example. A Si-Oxide-Si sandwich-like substrate is formed by SIMOX process using a high dose blanket implant of oxygen ions, and by a high temperature anneal cycle. This type of technology needs a high current implanter which is very costly. Beside the problem of gross implant crystalline damage the combined thickness of the active silicon region and the formed isolate silicon dioxide layer is limited by the magnitude of implant energy, which is a big process drawback of this technology.

Methods such as "Selective Epitaxial Growth" i.e., "SEP" and "Epitaxial Lateral Overgrowth" i.e., "ELO" are also developed to form totally isolate single-crystalline silicon islands on wafer where the active IC devices are built. In order to use this type of technology, modification of the current process must be made after the device lateral isolation step is done. It is obvious that methods of this type are less adaptable to the existing main IC manufacturing processes.

To form the dielectric isolated wafers as starting materials, another prior art of recrystallizing the polycrystalline silicon film was developed. It has illustrated in Richard L. Bates, "SOI Epitaxial Technology Perspective: ISE or SIMOX?" Microelectronic Manufacturing and testing, pp.11, March 1989. A movable strip heater is used to melt the polycrystalline silicon and regrow it into single crystalline silicon when the heater scans the top of the wafer which has already a deposited polycrystalline silicon layer.

SUMMARY OF THE PRESENT INVENTION

The process of forming the dielectric isolated semiconductor starting wafer materials is described. Wafers with oxide and deposited polycrystalline silicon film, which are both of high quality and certain desired thickness are put on top of a horizontal rotating stage, and secured by vacuum. Recrystallization of the polycrystalline film into single crystalline is carried out by concentric heating elements located directly above and aligned concentrically with the spinning wafer. To properly control the heating elements in such a manner that a circular donut-shaped melt zone is created in the underneath rotating wafer, and the radius of the melting zone is adequately increasing slowly. The recrystallization will proceed accordingly from the center of the wafer radially outward into the film area that covers the whole wafer.

This process can be carried in batch mode also, if a system of multiple horizontal rotating stages is used. The silicon moleculars inside the molten zone are subject to the tensional effect due to the circular centrifugal force which enables them to recrystallize into high quality single crystalline film. This centrifugal tensional effect is analogous to the role of tensional effect of the gravitational force in the Czochralski crystal growing case, though the two methods are not the same with respect to the direction of crystal growth. The present invention can be characterized as the "Centrifugally Tensioned, horizontally Recrystallizing Process".

DETAILED DESCRIPTION OF THE INVENTION

A process is disclosed for forming the dielectric isolated semiconductor starting wafers. In the following description, numerous specific details are set forth such as thickness and feature size in order to provide a thorough understanding of the present invention. It will be obvious, however, to one skilled in the art that the present invention may be practiced without these specific details. In other instances, well-known processing steps such as oxidation, masking and cleaning steps, etc., have not been set forth in order not to unnecessarily obscure the present invention.

The following description describes the formation of dielectric (oxide) isolated single crystalline silicon wafers used by IC manufacturers as the starting materials. It will be apparent that the process may be used to form other type of semiconductor dielectric isolated single crystalline materials or devices, and further other types of insulated and/or isolated single crystalline film materials or devices.

Figure 1:
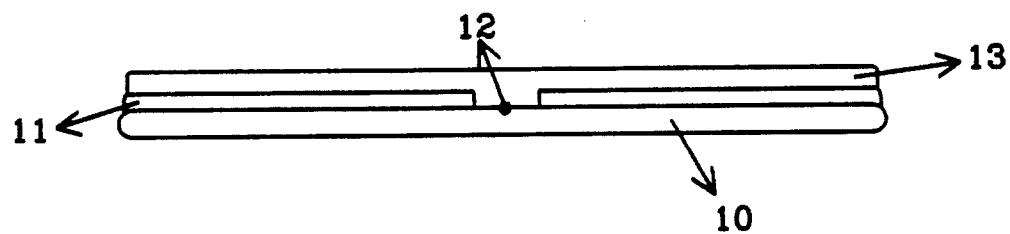
FIG. 1 is the cross sectional view of a prepared wafer before recrystallization. Isolate oxide layer 11 and polycrystalline silicon layer 13 have formed on single crystalline silicon substrate 10.

Referring to FIG. 1, substrate 10 is a common type of single crystalline silicon starting materials with or without doping of certain design. A low doping level is generally preferred for the case of IC starting wafers to avoid substrate autodoping and to minimize the substrate parasitic capacitance. First, the wafer is processed through an adequately designed clean cycle, for example, the MOS pre-gate-oxidation clean. A high quality oxide 11 of a desired thickness is formed on top of the substrate 10. Thermally grown oxide is generally preferred, MOS field oxide, for example. The thickness of this oxide layer 11 may vary over a range depending on the specific condition requirements. A typical range will be 0.7-1.5 microns. Masking and oxide etching are performed next on the wafer to define and open up the recrystallizing seed area 12 at the center area of the wafer. Any of the well-known masking and etching methods can be used here, for example, those methods described in S. K. Ghandhi's "VLSI FABRICATION PRINCIPLES, Silicon and Gallium Arsenide" book. The proper size of seed area 12 opening may vary apperciably depending on the crystalline and/or physical properties of the substrate 10, oxide layer 11 and the polycrystalline layer 13 that deposited next. A typical size range from 60 thousands to 200 thousand square mils. The polygonal shaped opening is defined by masking and is symmetrical with respect to the crystalline orientation of the substrate 10. For the (100) silicon starting materials, a circular opening is adequate. A polycrystalline silicon layer 13 with the specific designed thickness is deposited next on the patterned wafer, using anyone of the well-known chemical vapor deposition (CVD) process. The thickness of this deposited layer will determine the thickness of the final recrystallized single crystalline silicon layer. For the MOS devices, a thickness range is half micron to few microns. For state of the art CMOS process, an even thinner layer is needed. At this stage, the wafer is ready for the recrystallizing operation. A thin layer cap oxide may be deposited on top of layer 13 if preferred. It is important that all the process steps are carried out under a strict clean-room environment, Class 10 clean-room condition is preferred, because contamination of any sort will cause a low quality defect-prone film.

Figure 2:
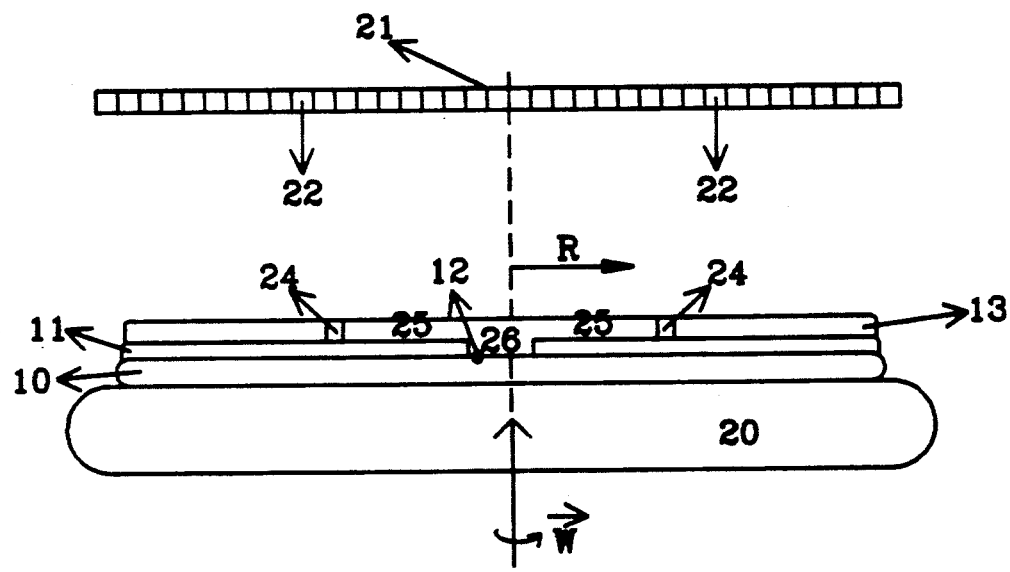
FIG. 2 illustrates the prepared wafer located on the horizontal rotating stage 20. Circular melting zone 24 has formed in poly layer 13.

The wafer that finished the poly deposition, is ready to be put on the rotatory stage 20 in FIG. 2, and the wafer is secured on the stage top by the built-in vacuum. The center of the seed area 12 of the wafer is aligned to the rotating axis of the stage 20. Located few centimeters to few inches above the rotatory stage 20, there is a fixed concentric heating unit 21 comprised with individually controlled circular heating elements of different radial R like 22. This individual heating elements can be made by graphite or other suitable materials. With properly electrical control, each heating element can only generates enough heat energy to melt just the polycrystalline silicon directly underneath them. So a donut shaped molten circular ring with the height equals to the thickness of the polycrystalline layer 13 is created inside the layer itself. As the circular heating elements are properly switched on continually from the inner most element to the outer most element, a circular molten ring of comparable radius is created accordingly in the poly layer 13. When the molten ring progress through the polycrystalline silicon layer from the center portion slowly to the periphery portion as its radius increasing, the polycrystalline silicon just outside the outer radius of the molten ring, melts continually due to temperature increase and the melted silicon just outside the inner radius crystallizes continually due to temperature decrease. In order to convert the polycrystalline silicon into single crystalline silicon, single crystalline seed region must be provided near the recrystallizing interface. According to present invention, this seed crystal area 12 is provided by the center portion of the surface area of the substrate 10, just under the seed region 26. At the beginning of the recrystallizing process, the inner most heating element is switched on and the polycrystalline silicon in seed region 26 melts. So the recrystallizing is proceeding upward first and converting the poly seed region 26 into single crystalline silicon. At the same time, the stage 20 starts to rotate. The centrifugal force, generated by the rotating stage with properly adjusted angular velocity provide the tensional factor in the radial and horizontal direction for the (single) crystal growing process. So this new process, unlike all the other recrystallizing process which depends only on the thermal (temperature gradient) effect. The recrystallizing rate of this new centrifugally tensioned, horizontally recrystallizing process and its final film product quality will be superior than that of the other processes.

It is known for any crystallizing process, the total entropy must decrease as the disorder of the system is decreasing. A sustainable crystallizing process must be in thermal equilibrium. This equilibrium can be satisfied through out the whole process by carefully quantify the process parameters such as input power to and switch rate of the heating elements, angular velocity of the rotating stage, polycrystalline film thickness and those well-understood process ambient conditions, etc., and c.

Beside all the advantages that dielectric isolated wafer usually has, the wafers manufactured by this process have the flexibility on thickness on both the high quality oxide and silicon films. It also has the flexibility on wafer size and film material that forms the buried film. It is compatible to the common IC starting materials and can be used by any existed and future IC processes without additional process modification. Since this new starting wafer materials have the seed region at the center, it provides an ideal substrate contact path area for the VLSI/ULSI circuit design, and it should be of particular importance to the wafer scale integration technology.

The present invention can be used not only for the silicon wafer materials, but also for the other types of semiconductor and/or crystalline materials.

While there has been shown and described what is considered at present to be the preferred embodiment of the present invention, it will be appreciated by those skill in the art that modification of such embodiment may be made. It is therefore desired that the invention not be limited to this embodiment. All the modifications that come within the meaning and range of equivalence thereof are intended to be embraced therein.

I claim:

1. A process for fabricating the dielectric isolated single crystalline silicon starting wafers, comprising the steps of:
   (a) forming the isolated oxide layer over the whole wafer area;
   (b) masking to define the symmetrical polygon shaped recrystallizing seed area at the center portion of the said wafer area and exposing the said seed area by etching;
   (c) forming a polycrystalline silicon layer on top of the said oxide layer and the said exposed seed area;
   (d) placing each of the said wafers securely on top of the rotating recrystallizing stage, with circular heating unit directly above therein, consisting plural of concentric heating elements;
   (e) recrystallizing the said secured wafer, by properly switching on and off continually from the inner most heating element to the outer most heating element of the said circular heating unit, from the said seed area radially outward to cover the said whole wafer area, under centrifugally tensioned condition generated by the said rotating stage, converting the said polycrystalline silicon layer into single crystalline silicon layer;
   (f) providing the substrate contact area for each of the said wafers by using its said seed area.

2. A process for fabricating the dielectric isolated single crystalline semiconductor starting wafers, comprising the steps of:
   (a) forming the isolating layer over the whole wafer area;
   (b) masking to define the recrystallizing seed area at the center portion of the said wafer area; and exposing the said seed area;
   (c) forming a polycrystalline semiconductor layer on top of the said isolating layer and the said exposed seed area;
   (d) placing each of the said wafers securely on top of the rotating recrystallizing stage, with circular heating unit directly above therein, consisting plural of concentric heating elements;
   (e) recrystallizing the said secured wafer, by properly switching on and off continually from the inner most heating element to the outer most heating element of the said circular heating unit, from the said seed area radially outward to cover the said whole wafer area, under centrifugally tensioned condition generated by the said rotating stage, converting the said polycrystalline semiconductor layer into single crystalline semiconductor layer;
   (f) providing the substrate contact area for each of the said wafers by using its said seed area.

3. A process for fabricating the isolated single crystalline thin film comprising the steps of:
   (a) forming the isolating layer over the whole substrate area;
   (b) masking to define the recrystallizing seed area at the center portion of the said substrate area; and exposing the said seed area;
   (c) forming a polycrystalline thin film layer on top of the said isolating layer and the said exposed seed area;
   (d) placing each of the said substrate securely on top of the rotating recrystallizing stage, with circular heating unit directly above therein, consisting plural of concentric heating elements;
   (e) recrystallizing the said secured substrate, by properly switching on and off continually from the inner most heating element to the outer most heating element of the said circular heating unit, from the said seed area radially outward to cover the said whole substrate area, under centrifugally tensioned condition generated by the said rotating stage, converting the said polycrystalline thin film into single crystalline thin film.

* * * * *